United States Patent [19]

Kurokawa

[11] 4,323,853
[45] Apr. 6, 1982

[54] CIRCUIT FOR PROTECTING TRAVELING-WAVE TUBES AGAINST FAULTS OF A POWER SUPPLY

[75] Inventor: Teruhisa Kurokawa, Tokyo, Japan

[73] Assignee: Nippon Electric Co., Ltd., Tokyo, Japan

[21] Appl. No.: 123,827

[22] Filed: Feb. 22, 1980

[30] Foreign Application Priority Data

Feb. 23, 1979 [JP] Japan ................................ 54-21144

[51] Int. Cl.³ .............................................. H03F 5/38
[52] U.S. Cl. ..................................... 330/43; 315/3.5; 315/3.6; 328/8; 328/10; 361/112
[58] Field of Search ................... 315/3.5, 3.6; 330/43; 328/8, 9, 10; 361/112

[56] References Cited

U.S. PATENT DOCUMENTS

| | | | |
|---|---|---|---|
| 3,084,284 | 4/1963 | Schultz, Sr. et al. | 328/9 |
| 3,786,275 | 1/1974 | Quesinberry et al. | 328/8 |
| 3,890,545 | 6/1975 | Rosen | 315/3.5 |
| 4,000,471 | 12/1976 | Pankow | 330/43 |
| 4,066,965 | 1/1978 | Schultz et al. | 330/43 |
| 4,104,597 | 8/1978 | Jacobus, Jr. | 330/43 |

*Primary Examiner*—Saxfield Chatmon, Jr.
*Attorney, Agent, or Firm*—Laff, Whitesel, Conte & Saret

[57] ABSTRACT

A traveling-wave tube protection circuit prevents faults in its associated power source from damaging it. The power source supplied DC voltages to the collector, slow-wave circuit, anode and cathode of the traveling-wave tube. A power source control circuit is provided between the anode electrode and the anode power source circuit and is used for applying a control voltage to the anode electrode. The control voltage stops the operation of the traveling-wave tube during the transient times which occur responsive to the initiation and the termination of the power source circuit operations. On shutdown, the power source control circuit also stops the supply of the control voltage to the anode electrode after the transient response is terminated. The power source control circuit has a high-frequency oscillator driven in response to either the initiation or the termination of the operation of the power supply means. To stop the operation of the traveling-wave tube, a control voltage is obtained from the output of the high-frequency oscillator, rectified and used to charge a capacitor which operates the oscillator for a predetermined time interval after the power supply ends.

3 Claims, 4 Drawing Figures

CIRCUIT FOR PROTECTING TRAVELING-WAVE TUBES AGAINST FAULTS OF A POWER SUPPLY

The present invention relates to circuits for protecting a traveling-wave tube (TWT) amplifier of microwave signals, especially as used in microwave communication systems, or the like.

As is well-known, a traveling-wave tube generally has a plurality of electrodes which are: a cathode, a collector, a slow-wave circuit, and an anode. Reference is made to U.S. Pat. No. 3,300,678 for greater detail. The voltages for these electrodes are supplied from a TWT power source.

In such a TWT, electrons are emitted from the cathode, focused by a magnetic field, and accelerated in response to the anode voltage. Finally, the electrons reach the collector after passing through the slow-wave circuit. When the anode voltage is equal to or lower than the cathode voltage, the electrons are not accelerated and they fail to reach the slow-wave circuit or the collector.

When the voltages of the collector, the slow-wave circuit, and the anode are properly selected, with respect to the cathode voltage, the electrons emitted from the cathode are accelerated so that they reach the collector with little electron flow into the slow-wave circuit. Nevertheless, the electrons do flow from the cathode into the slow-wave circuit when the voltage of the collector or the slow-wave circuit exceeds a tolerance level with respect to the cathode voltage. As a result, the energy of the electrons damages the slow-wave circuit and, more adversely, affects the TWT itself.

Accordingly, in a situation where the voltage relationship among the electrodes is such that the TWT may be damaged, it is necessary for the anode voltage to be set approximately the same as the cathode voltage, so that an electron beam does not flow. Such an unbalanced voltage situation generally takes place during a transient time while power turns on or off. Thus, it is necessary to control the anode voltage so that it is approximately the same as the cathode voltage during such transient times.

To effect the above-described transient time control, one of the known approaches employs a power source which is exclusively dedicated to supplying the anode; therefore, the anode voltage is controlled if the power source is directly controlled. The anode power source must be highly stable, and must not introduce noise because a variation of the anode voltage changes the gain of the TWT. This leads to increased manufacturing costs.

Another known approach for controlling the anode voltage uses a divided voltage supply for the slow-wave circuit. In this approach, a high-voltage mechanical switch is used to turn the anode power source on or off. As a result, the slow response of the mechanical switch is insufficient to protect the TWT from damage.

Accordingly, an object of the present invention is to provide a circuit for protecting the TWT from damage due to faults in the TWT power source. Another object is to provide inexpensive and simple protection in a circuit which has a quick response.

According to the invention, a traveling-wave tube protection circuit prevents faults in its associated AC power supply from damaging it. A power source supplies DC voltages to the collector, slow-wave circuit, anode and cathode of the traveling-wave tube. A power source control circuit is provided between the anode electrode, and the anode power source used for applying a control voltage to the anode electrode. The control voltage stops the operation of the traveling-wave tube during the transient times which occur responsive to the initiation and the termination of the power source operations. The power source control circuit also stops the supply of the control voltage to the anode electrode after the transient response is terminated. The power source control circuit has a high-frequency oscillator driven in response to the initiation and the termination of the operation of the AC power supply. To drive the high-frequency oscillator, a rectifying and smoothing circuit rectifies and smoothes the AC power to provide a DC voltage, which is held by a capacitor to operate the oscillator for a predetermined time interval after the initiation and the termination of the operation of the AC power supply.

The invention will next be described in detail, with reference to the accompanying drawings, in which.

Figure 1:
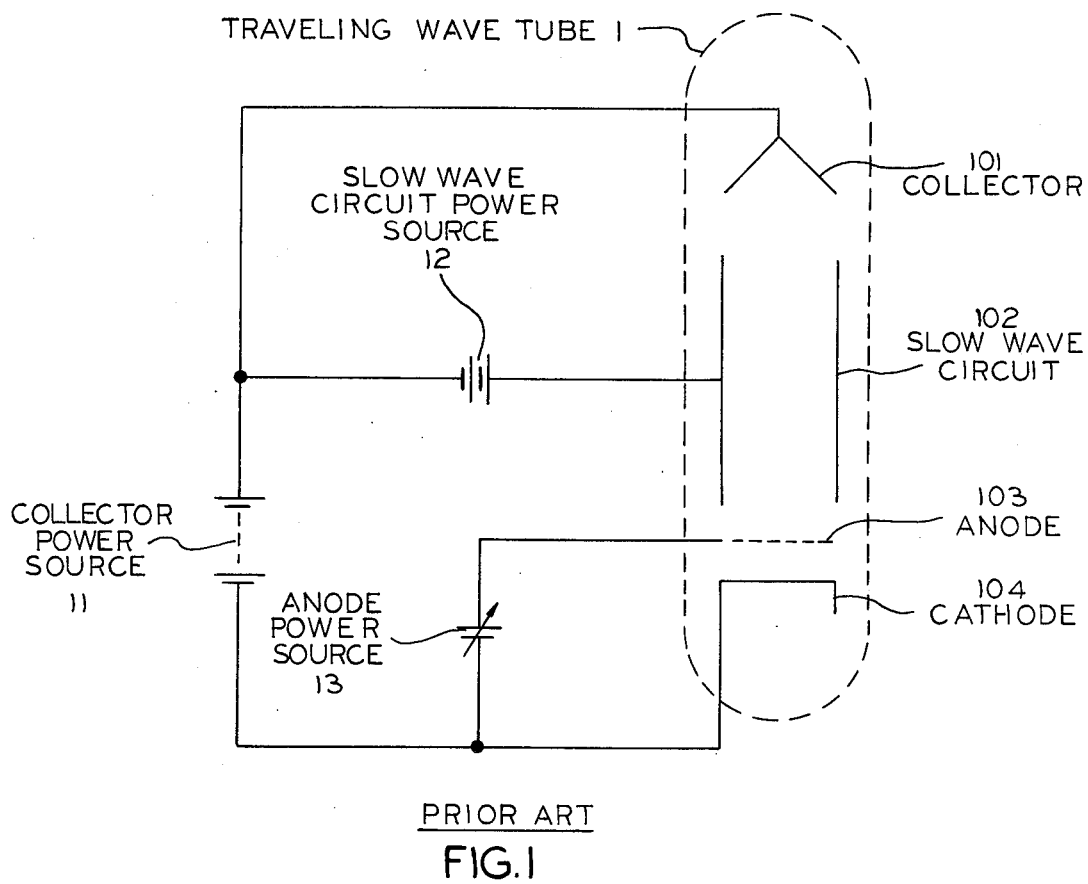
FIG. 1 is a schematic circuit diagram explaining the principle of a conventional TWT protection circuit, with a power source for controlling the anode voltage.

In the drawing and in the specification, a conventional cathode heater power source and its related circuits and components are omitted for convenience and simplicity.

FIG. 1 includes a collector power source 11, a power source 12 for a slow-wave circuit which is superposed on collector power source 11, an anode power source 13, a traveling-wave tube (TWT) 1, a collector electrode 101, a slow-wave circuit 102, an anode electrode 103, and a cathode electrode 104. This circuit controls the flow of electrons by controlling the anode power source 13, in order to prevent damage to the traveling-wave tube (TWT).

The anode power source 13 must be a high-voltage source, used exclusively for the anode. Further, it must be highly stable and noiseless, since a change of voltage from the anode power source 13 changes the gain of the TWT. Additionally, the anode power source circuit must have a small time constant, since the anode voltage must be interrupted quickly. Transients, which cannot exceed a tolerance, might be created when the voltage terminates on each electrode of the TWT 1 as, for example, when there is a power failure. Because of these requirements, the TWT protection power source shown in FIG. 1 has a high manufacturing cost.

Figure 2:
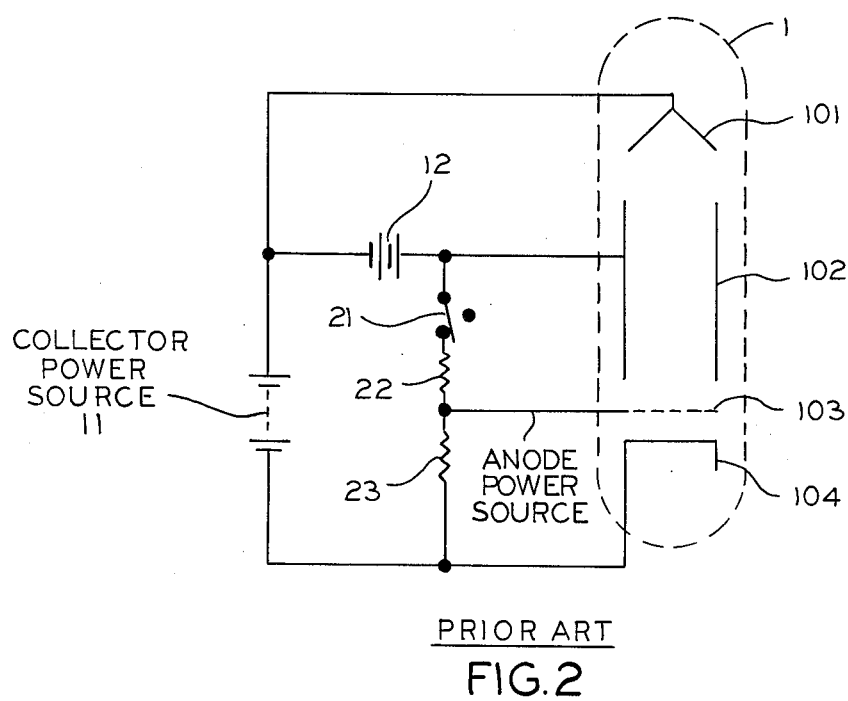
FIG. 2 is a similar circuit diagram explaining the principle of a conventional TWT protection circuit, with a mechanical switch to divide the slow-wave circuit voltage for controlling the anode voltage.

FIG. 2 is a schematic diagram of another conventional power source circuit for protecting a traveling-wave tube. The figure includes a mechanical switch 21 for a high-voltage power source and a resistor voltage divider 22 and 23. The normal bias voltage of a slow-wave circuit 102 is divided by the voltage-dividing resistors 22 and 23 to produce an appropriate intermediate anode voltage. The control voltage is selectively applied to anode 103 by mechanical switch 21 which responds automatically to power failures. The response speed of the circuit is insufficient to protect the TWT because of the slow response time of the mechanical switch 21.

Figure 3:
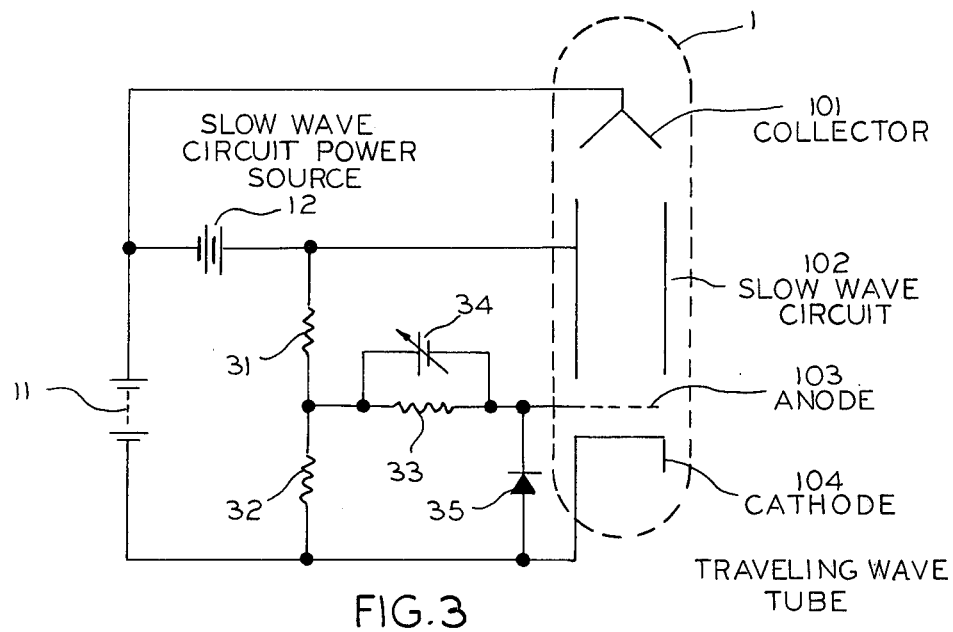
FIG. 3 is a circuit diagram explaining the principle of a TWT protection circuit, according to the invention.

FIG. 3 schematically illustrates a TWT protection circuit, according to the invention. The figure includes resistors 31 to 33, a variable power source 34, and a diode 35. To turn on the power source, the power source 34 is first turned on, so that a bias voltage applied to the anode 103 is more negative than the negative bias voltage at the cathode 104. The more negative valve is determined by a forward voltage drop across the diode 35. Following the turn-on of the power source 34, the power sources 11 and 12 are turned on. Under this condition, the voltage difference between the anode 103 and the cathode 104 is the difference between the voltage determined by the voltage-dividing resistor 31 and 32 and the voltage of the power source 34. After a time period sufficient for any transient from the power sources 11 and 12 to subside, the voltage of the power source 34 is reduced to zero in order to set the voltage of anode 103 at the voltage determined by the resistors 31 and 32. In this way, the TWT enters a normal operation phase. Also, when the TWT operates normally, the power source 34 does not affect the anode voltage. Therefore, an inexpensive power source may be used for the power source 34, because it is not necessary to consider stability and noise parameters.

The description given applies if the voltage of the anode 103 is lower than or equal to the voltage of the slow-wave circuit 102. However, when other types of traveling-wave tubes are used, the voltage of the anode 103 may be higher than that of the slow-wave circuit 102. In such cases, the principle of the circuit operation is the same as that of the circuit shown in FIG. 3, but another power source is required for adjusting the voltage difference between electrodes of the anode and the slow-wave circuit.

When the power source to all of the electrodes is simultaneously interrupted, as in the case of zero output power failure, the anode voltage must approach the cathode voltage quickly. Otherwise, energy stored in the filter capacitors of the various power sources may damage the slow-wave circuit.

Figure 4:
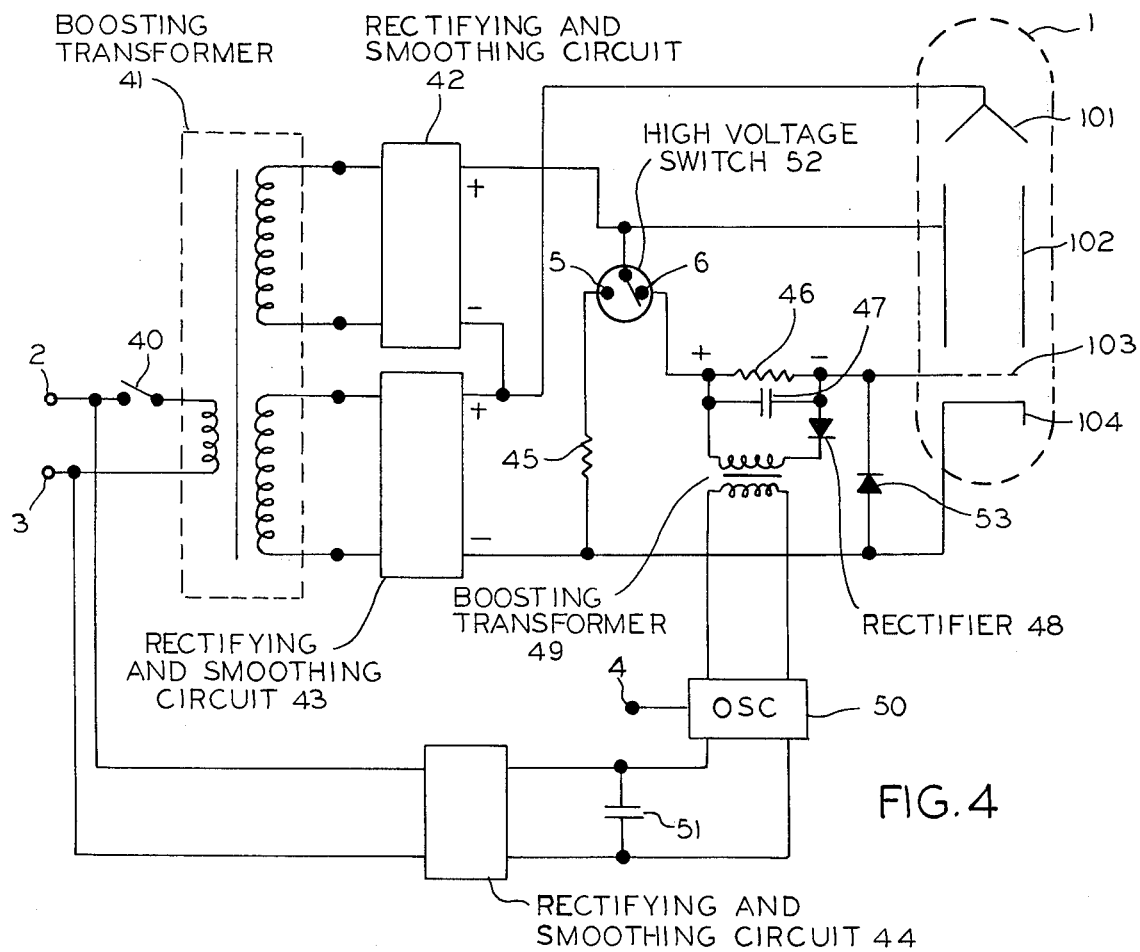
FIG. 4 is a circuit diagram of a power source circuit including the TWT protection circuit, according to the invention.

An embodiment of an anode power source circuit capable of protecting the type of traveling-wave tube described above is shown in FIG. 4. The figure includes a power off/on switch 40, a boosting transformer 41, rectifying and filtering or smoothing circuits 42,43 and 44, resistors 45 and 46, a capacitor 47 having a capacitance which is lower than that of any capacitors (not shown) included in the rectifying and smoothing circuits 42 and 43, a rectifier 48, a boosting transformer 49, a high-frequency oscillator 50, a capacitor 51 having a relatively large capacitance, a high-voltage switch 52, such as a vacuum switch which is responsive to power interruptions, a diode 53 which corresponds to diode 35 in FIG. 3, and a number of terminals 2 to 6.

A 50 Hz or 60 Hz AC power is applied to terminals 2 and 3 and is transmitted through switch 50 to transformer 41, where the voltage is boosted, and applied to rectifying and smoothing circuits 42 and 43. Each output of rectifying and smoothing circuits 42 and 43 is a high-voltage DC power. Rectifying and smoothing circuit 43 provides power for collector 101. Rectifying and smoothing circuit 42, together with rectifying and smoothing circuit 43, provides power for the slow-wave circuit 102. The type of TWT 1 used in this application is designed to operate with the anode 103 at the same voltage as the slow-wave circuit 102. Thus, anode power is also supplied from rectifying and smoothing circuits 42,43 via switch 52 and resistor 46 to anode 103.

The AC power applied to terminals 2 and 3 is also transmitted to rectifying and smoothing circuit 44 where it is rectified and smoothed to become DC power. The output of the rectifying and smoothing circuit 44 is applied to a capacitor 51 and a high-frequency oscillator 50. The oscillator 50 generates a high-frequency signal which is started and stopped by a drive signal (not shown) applied to terminal 4. The output voltage of the oscillator 50 is boosted by the boosting transformer 49, rectified by the rectifier 48, smoothed by the capacitor 47, and applied across the resistor 46.

The switch 52 is controlled so that it is turned to terminal 5 when AC power is not applied to the terminals 2 and 3, and to terminal 6 when AC power is applied. In order to start the TWT 1, the switch 52 is first turned to the terminal 5 in response to the application of AC power to the terminals 2 and 3. At the same time, the switch 40 remains turned off. The oscillator is supplied with its driving power from the terminals 2 and 3 by means of the rectifying and smoothing circuit 44 and the capacitor 51. Next, a control signal is applied to the terminal 4 to activate the oscillator 50. The output of oscillator 50 produces a necessary voltage which is applied through transformer 49, rectifier 48 and across the resistor 46 and smoothing capacitor 47. The anode voltage is negative with respect to cathode 104 because of diode 48 in the transformer circuit, since diode 53 is forward biased. Under this condition, the switch 40 is closed. Thus, the transformer 41 and rectifying and smoothing circuits 42 and 43 apply voltages to collector 101 and slow-wave circuit 102. After all transients have subsided and a predetermined steady-state voltage is reached, the oscillator 50 is stopped by a control signal applied to terminal 4 and the normal voltage is applied to the anode 103. The TWT 1 is now in the normal operating mode.

To stop the operation of the TWT, the oscillator 50 is first actuated by a control signal applied to terminal 4 to bring the anode voltage close to the cathode voltage, thereby stopping the flow of electrons within the TWT. Next, the switch 40 is opened to interrupt the power to the collector 101 and the slow-wave circuit 102. Then, the switch 52 is turned to terminal 5 to discharge, through the resistor 45, the smoothing capacitor, or the like, in the rectifying and smoothing circuits 42 and 43. Finally, the oscillator 50 is stopped.

In the event of a power interruption, the AC power input normally applied to terminals 2 and 3 is lost, and the respective electrode voltages fall without a normal sequence. When the power interruption occurs, the oscillator 50 is immediately activated by a signal applied through terminal 4 by an external detecting circuit, which detects either the power interruption, or the current flowing into the slow wave circuit which exceeds a predetermined value. The detecting circuit can use, for example, a helix current detecting circuit shown in a paper published by Varian Associates, Inc. in October, 1967. The output of the oscillator 50, applied through associated circuitry, brings the anode voltage close to the cathode voltage. Since the switches 40 and 52 are mechanical, they response to the power failure later than the electronically activated oscillator 50 begins to operate. That is, after the oscillator 50 begins operation, switch 52 turns to terminal 5, and switch 40 opens. The energy stored in smoothing circuits 42 and 43 is discharged through switch 52 and resistor 45. The oscillator 50 operates for a limited time period on energy supplied by capacitor 51. The capacitor 51 has enough energy to hold the anode voltage close to the cathode voltage from the time when the power supply stops until the switch 52 turns to terminal 5. Thus, excessive current does not flow into the slow-wave circuit even at the time of a power interruption. Therefore, the TWT is completely protected from damage due to the flow of excessive slow-wave circuit current.

Reference is made to a co-pending application entitled "Voltage Detection Circuits for A-C Power Supplies," by Takuichi Tsuchiya and Hiroshi Togo, inventors, Ser. No. 123,828, filed Feb. 22, 1980 (corresponds to Japanese application 22118/79). Terminal 4 in this application corresponds to terminal 6 in that application.

Those who are skilled in the art will readily perceive how to modify the system. Therefore, the appended claims are to be construed to cover all equivalent structures which fall within the true scope and spirit of the invention.

What is claimed is:

1. A traveling-wave tube apparatus comprising:
   AC power supply means;
   traveling-wave tube means having a collector electrode, a slow-wave circuit electrode, an anode electrode and a cathode electrode;
   power source means responsive to said AC power supply for providing DC voltages to each of said electrodes;
   high-frequency oscillator means driven in response to the initiation, termination and interruption in the operation of said AC power for providing a high frequency output;
   first rectifying and smoothing circuit means for rectifying and smoothing said high frequency output to provide said anode electrode with a control voltage, said control voltage preventing the electron beam from flowing from said cathode electrode to said slow-wave circuit electrode; and
   energizing means coupled between said AC power supply means and said high-frequency oscillator means for energing said high-frequency oscillator means,
   whereby said traveling-wave tube is protected from damage during said initiation, termination and interruption.

2. The traveling-wave tube apparatus claimed in claim 1, wherein said energizing means includes second rectifying and smoothing means for rectifying and smoothing the output of said AC power supply means to provide a driving DC voltage, said driving DC voltage energizing said high-frequency oscillator means; and capacitor means coupled between said second rectifying and smoothing means and said high-frequency oscillator means for holding said driving DC voltage during a predetermined time interval after the start of said initiation and termination of the operation.

3. The traveling-wave tube apparatus claimed in claim 1 further comprising diode means connected between said anode and cathode electrodes and poled to be forwardly biased when said control voltage is supplied to said anode electrode.

* * * * *